United States Patent
Srivastava

(10) Patent No.: US 11,574,173 B2
(45) Date of Patent: Feb. 7, 2023

(54) POWER EFFICIENT NEAR MEMORY ANALOG MULTIPLY-AND-ACCUMULATE (MAC)

(71) Applicant: QUALCOMM Incorporated, San Diego, CA (US)

(72) Inventor: Ankit Srivastava, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 554 days.

(21) Appl. No.: 16/721,819

(22) Filed: Dec. 19, 2019

(65) Prior Publication Data

US 2021/0192324 A1    Jun. 24, 2021

(51) Int. Cl.
| | |
|---|---|
| *G06N 3/08* | (2006.01) |
| *G06N 3/04* | (2006.01) |
| *G11C 11/412* | (2006.01) |
| *G06N 3/063* | (2023.01) |
| *G06F 7/544* | (2006.01) |
| *G11C 11/418* | (2006.01) |
| *G11C 11/419* | (2006.01) |

(52) U.S. Cl.
CPC ........... *G06N 3/063* (2013.01); *G06F 7/5443* (2013.01); *G06N 3/04* (2013.01); *G06N 3/08* (2013.01); *G11C 11/412* (2013.01); *G11C 11/418* (2013.01); *G11C 11/419* (2013.01)

(58) Field of Classification Search
CPC . G06N 3/063; G06N 3/04; G06N 3/08; G06F 7/5443; G11C 11/412; G11C 11/418; G11C 11/419
USPC ......................................................... 706/25
See application file for complete search history.

(56) References Cited

U.S. PATENT DOCUMENTS

| | | | | |
|---|---|---|---|---|
| 10,825,536 | B1* | 11/2020 | Yang | .................... G11C 11/5692 |
| 11,335,387 | B2* | 5/2022 | Shan | ......................... G11C 7/12 |
| 2019/0370640 | A1* | 12/2019 | Peng | .................... G06N 3/0635 |
| 2020/0401414 | A1* | 12/2020 | Ware | ....................... G06F 7/501 |

FOREIGN PATENT DOCUMENTS

| | | |
|---|---|---|
| CN | 110363292 A | 10/2019 |
| CN | 110414677 A | 11/2019 |
| EP | 3564865 A1 | 11/2019 |

OTHER PUBLICATIONS

International Search Report and Written Opinion—PCT/US2020/064630—ISA/EPO—dated Apr. 19, 2021.

\* cited by examiner

*Primary Examiner* — Ly D Pham
(74) *Attorney, Agent, or Firm* — Qualcomm Incorporated

(57) ABSTRACT

A near memory system is provided for the calculation of a layer in a machine learning application. The near memory system includes an array of memory cells for storing an array of filter weights. A multiply-and-accumulate circuit couples to columns of the array to form the calculation of the layer.

24 Claims, 9 Drawing Sheets

US 11,574,173 B2

POWER EFFICIENT NEAR MEMORY ANALOG MULTIPLY-AND-ACCUMULATE (MAC)

TECHNICAL FIELD

This application relates to multiply-and-accumulate (MAC) circuits, and more particularly, to a power efficient near memory analog MAC.

BACKGROUND

Computer processing of data typically uses a Von Neumann architecture in which the data is retrieved from a memory to be processed in an arithmetic and logic unit. In computation-intensive applications such as machine learning, the data flow from and to the memory becomes a bottleneck for processing speed. To address this data movement bottleneck, near memory architectures have been developed in which the data processing hardware is adjacent the memory cells.

SUMMARY

In accordance with a first aspect of the disclosure, a near memory system is provided that includes: an array of memory cells arranged into a plurality of rows and into a plurality of columns, wherein each row is configured to store a plurality of filter weights for a layer in a machine-learning application; and a multiply-and-accumulate (MAC) circuit coupled to each column, the MAC circuit being configured to multiply the plurality of filter weights from an accessed-one of the rows with a corresponding plurality of inputs to provide a plurality of products, the MAC circuit being further configured to sum the plurality of products to provide an output for the layer.

In accordance with a second aspect of the disclosure, a near memory system is provided that includes: a plurality of arrays of memory cells, wherein each array is arranged into a plurality of rows and columns, and wherein each row is further configured to store a plurality of filter weights for a layer in a machine-learning application, and wherein each array of memory cells is subdivided into a plurality of sub-arrays; and a plurality of multiply-and-accumulate (MAC) circuits corresponding to the plurality of sub-arrays, each MAC circuit being coupled to each column in the corresponding sub-array, each MAC circuit being configured to multiply the plurality of filter weights from an accessed-one of the rows in the corresponding sub-array with a corresponding plurality of inputs to provide a plurality of products, the MAC circuit being further configured to sum the plurality of products to provide a sum, and wherein each array further includes an adder to add the sums from the array's MAC circuits to form an output for the array.

In accordance with a third aspect of the disclosure, a method for a near memory system is provided that includes: asserting a word line for a row of memory cells to retrieve a plurality of filter weights for an output neuron in a layer for a machine learning application; in a multiply-and-accumulate circuit coupled to the row of memory cells, multiplying the plurality of filter weights with a plurality of input neurons to form a plurality of products; and summing the plurality of products to calculate a value for the output neuron.

These and other advantageous features may be better appreciated through the following detailed description.

BRIEF DESCRIPTION OF THE DRAWINGS

Embodiments of the present disclosure and their advantages are best understood by referring to the detailed description that follows. It should be appreciated that like reference numerals are used to identify like elements illustrated in one or more of the figures.

DETAILED DESCRIPTION

Figure 1:
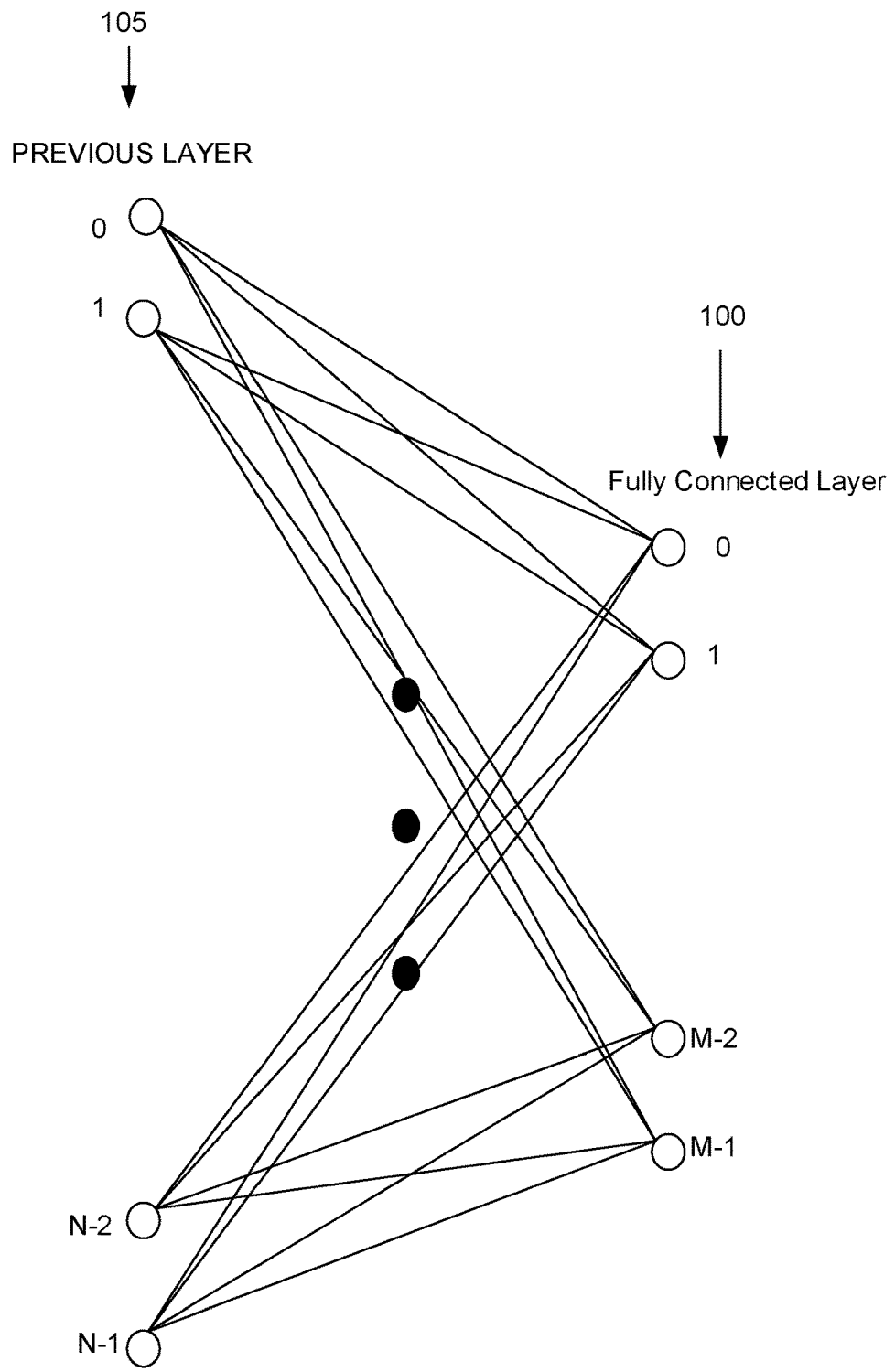
FIG. 1 illustrates a conventional fully-connected layer for a neural network.

A near memory architecture is provided with a multiply-and-accumulate (MAC) circuit for the multiplication of a plurality of input neurons from a previous layer in a machine learning application with a plurality of filter weights to form a plurality of products. The MAC circuit sums the products to compute an output neuron for a layer (e.g., a fully-connected layer) in the machine learning application. Although the following discussion is directed to machine learning embodiments, it will be appreciated that the multiplication of other types of input vectors and filter weights may be calculated using a near memory with a MAC circuit as disclosed herein. An example fully connected layer 100 having M output neurons is shown in FIG. 1. The M output neurons range from a zeroth output neuron to an (M−1)th output neuron. A previous layer 105 includes N input neurons ranging from a zeroth input neuron to an (N−1)th input neuron. In general, the integer N is substantially larger than the integer M. For illustration clarity, only the first two and last neurons are shown for each layer.

Each output neuron in fully connected layer 100 receives a weighted version of every input neuron in previous layer 105. For example, input neuron 0 in fully connected layer 100 receives a weighted version of the zeroth input neuron, a weighted version of the first input neuron, and so on to a weighted version of the (N−1)th input neuron. Each output neuron in fully connected layer 100 is thus associated with N weights for the weighting of the input neurons from previous layer 105. As used herein, the weights for an output neuron in fully connected layer 100 are collective denoted as a filter. Each weight is thus also denoted as a filter weight. A memory having an array of bitcells is disclosed herein for the storing of the corresponding filters. The array of bitcells is arranged by rows and columns. If each filter weight is a one-bit filter weight, each row may correspond to a filter for an output neuron. For example, suppose there are 128 output neurons having one-bit filter weights, the array of bitcells would then have 128 rows. The number of columns for the array of bitcells corresponds to the number of input neurons in such an embodiment. The filter weights may be multi-bit filter weights in alternative embodiments. Each filter would thus correspond to a set of rows in such multi-bit filter weight embodiments. The number of rows in each set of rows corresponds to the width (number of bits) for the multi-bit filter weight embodiments. In each set of rows, each row would then correspond to a bit of the multi-bit weight as will be further explained herein.

To calculate the value for an output neuron, a read operation occurs on the corresponding row in a one-bit filter weight embodiment (or sequentially across the corresponding set of rows in a multi-bit weight embodiment) to access the stored filter weights. The accessed stored filter weights are then multiplied by the corresponding input neurons. The products from all the multiplications of the stored filter weights with their corresponding input neurons are summed to form an output neuron. While the multiplication of a stored filter weight with the corresponding input neuron could be performed using a compute-in-memory bitcell, note that a fully-connected layer has the majority of the weights in a machine learning application. A compute-in-memory bitcell is markedly larger than a traditional six-transistor (6T) static random access memory (SRAM) bitcell. Thus, storing the filter weights in a compute-in-memory architecture for implementing the fully-connected layer would require a relatively large amount of die space (e.g., approximately four times as much) as would be required for a conventional 6T bitcell array. In addition, the read and write energy in for a compute-in-memory implementation is relatively high.

A near memory architecture that includes, in some embodiments, a 6T array of bitcells arranged by rows and columns for storing the filter weights is thus disclosed. The rows correspond to the filters such that there is a row (or set of rows in a multi-bit filter weight embodiment) of bitcells for each output neuron. A row of bitcells is accessed at a time in a read operation to retrieve the stored filter weights so as to calculate the corresponding output neuron. In particular, each row of bitcells has its own word line whereas each column of bitcells has its bit line pair formed by a bit line and a complement bit line. To calculate an output neuron, a voltage for the word line is asserted. Each column's bit line pair is then charged according to the stored weight in the accessed bitcell. To perform the multiplication of this stored weight as represented by the column's charged bit line pair, each column is associated with a MAC circuit that performs the multiplication of stored weight with the corresponding input neuron. The MAC circuit sums the resulting products to complete the calculation for an output neuron.

Figure 2A:
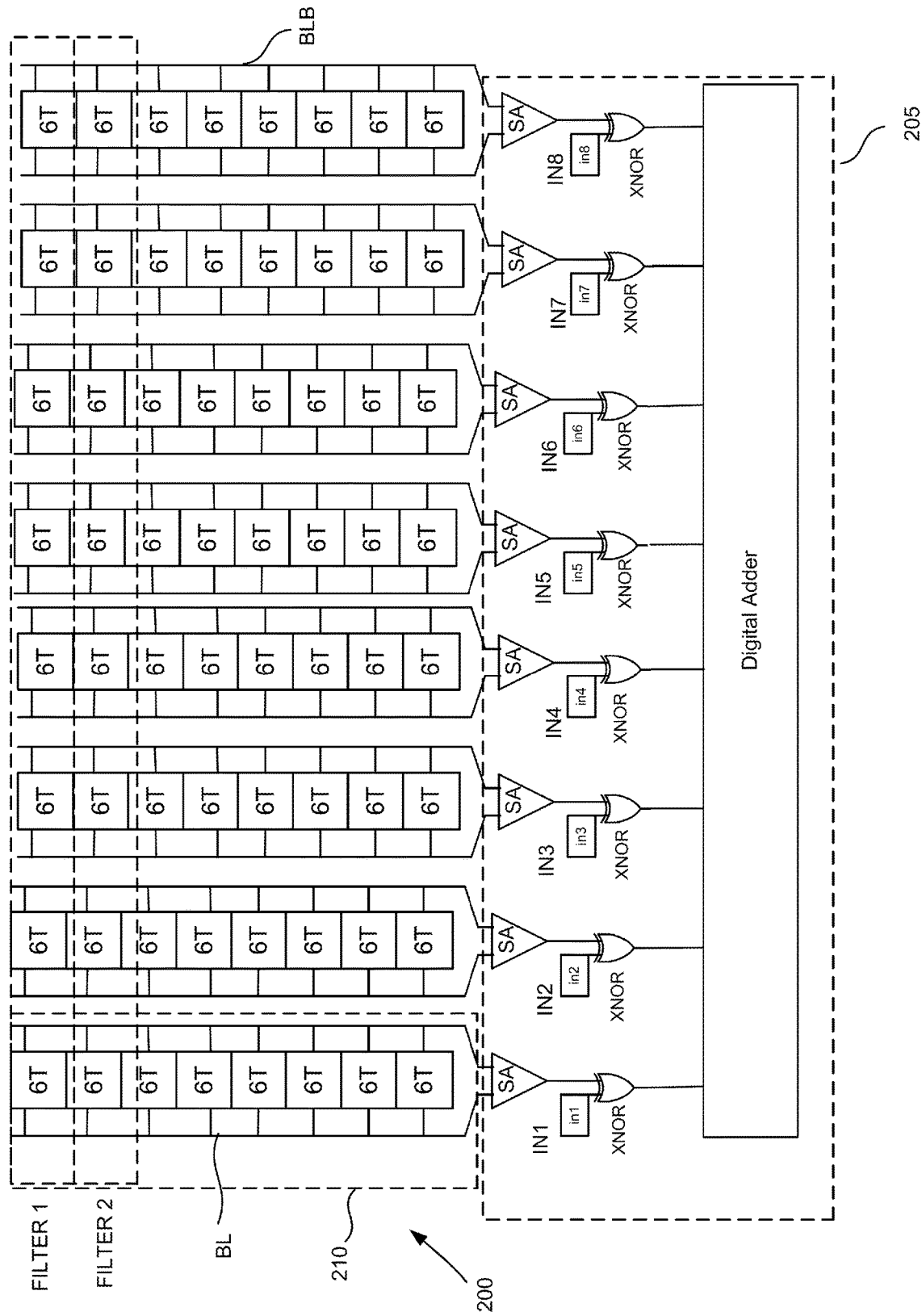
FIG. 2A illustrates a near memory system with a digital multiply-and-accumulate (MAC) circuit in accordance with an aspect of the disclosure.

An example near memory system 200 for a one-bit filter weight embodiment is shown in FIG. 2A. An array of bitcells (e.g., six transistor (6T) bitcells) are arranged in rows and columns. Each row corresponds to a filter for an output neuron. In other words, the bitcells across a row store the filter weights for the output neuron. Each row corresponds to an output neuron on a one-to-one basis. Each output neuron is also denoted herein as an output for brevity. Similarly, each input neuron is also denoted herein as an input for brevity. Since there is a filter weight for each input, each column of bitcells corresponds to an input on a one-to-one basis. For illustration clarity, only a first row of bit cells (Filter 1) and a second row (Filter 2) are labeled in FIG. 2A. Each column of bitcells has a bit line pair formed by a bit line (BL) and a complement bit line (BLB). A MAC circuit 205 calculates the multiplication of the filter weights for an output with the corresponding inputs. In this multiplication, a first input is multiplied by a first filter weight to form a first product, a second input is multiplied by a second filter weight to form a second product, and so on. The MAC circuit sums the resulting products from an accessed row to calculate the corresponding output for the fully-connected layer. This calculation occurs on a filter-by-filter basis (which is equivalent to an output-by-output basis). To access a row of stored filter weights, a word line (not illustrated) for the row is asserted. The bit line pair for each column then is charged with the stored filter weight for the bitcell at the intersection of the column with the accessed row. To make a bit decision as what the stored filter weight is from the charged bit line pair, MAC circuit 205 includes a sense amplifier (SA) for each column. However, note that the sense amplifiers may be deleted in alternative embodiments. For example, the sense amplifiers may be replaced by latches in alternative embodiments. In addition, MAC circuit 205 also includes a logic gate such as an exclusive-not-or (XNOR) logic gate for each column. Each column's XNOR gate receives the stored filter weight from the column's sense amplifier. In alternative embodiments, exclusive-or (XOR) gates or other suitable logic gates may be used to perform the binary multiplications. In some embodiments without sense amplifiers, each XNOR gate receives the true bit line directly (or the complement bit line).

Near memory system 200 includes just eight columns of bitcells for illustration purposes. For illustration clarity, only a first column 210 is annotated in FIG. 2A. The eight columns thus correspond to eight input neurons ranging from an input neuron IN1 to an input neuron IN8. Each column's XNOR gate XNORs the column's stored filter weight with the column's input neuron to calculate the product for the binary multiplication. MAC circuit 205 includes a digital adder to add the products (the XNOR gate output signals) to finish the calculation of the output neuron for the accessed row. MAC circuit 205 would thus sequentially calculate the various output neurons. This creates some latency but it is manageable since the number of output neurons for a fully connected layer is typically relatively small.

Figure 2B:
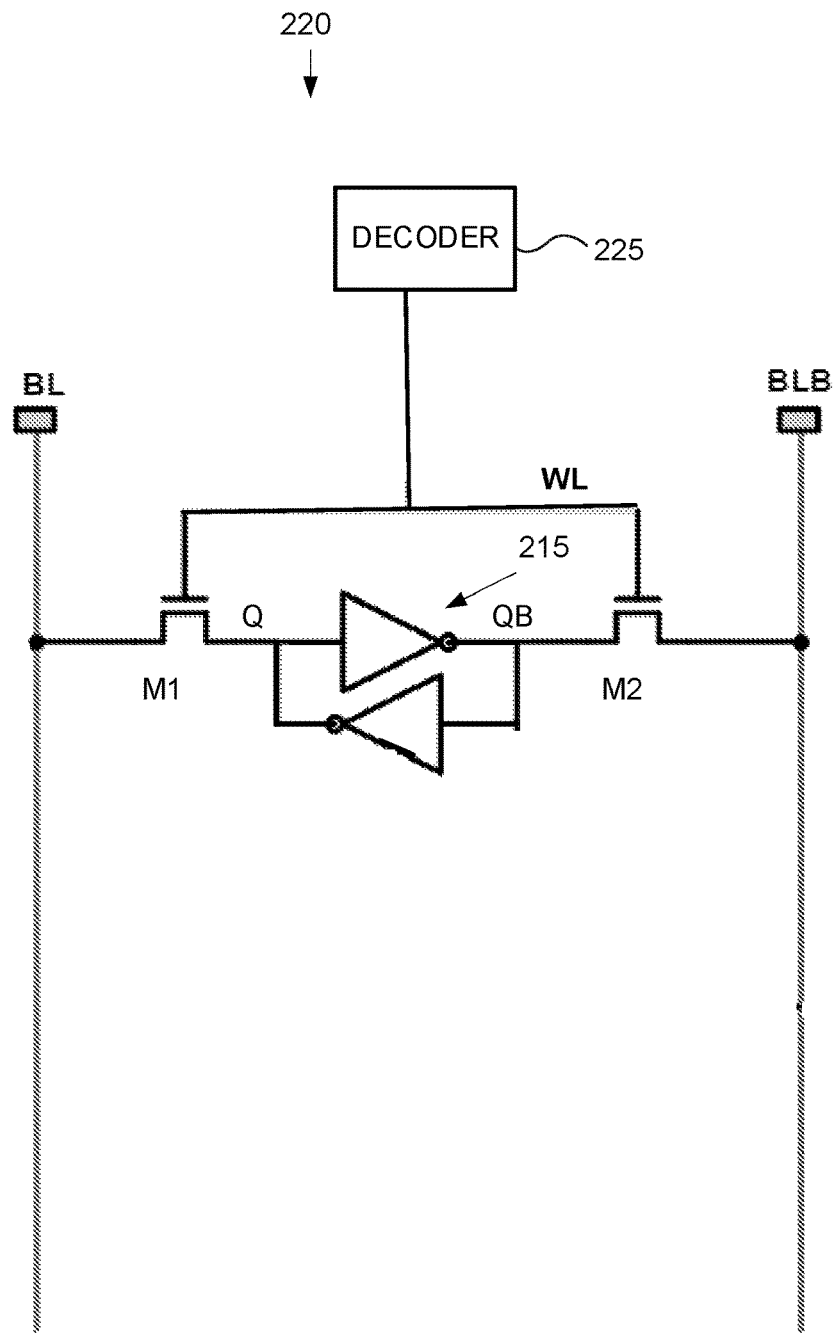
FIG. 2B illustrates a bitcell and a decoder for a near memory system in accordance with an aspect of the disclosure.

An example bitcell 220 for near memory system 200 is shown in more detail in FIG. 2B. The stored filter weight in some embodiments is latched by a pair of cross-coupled inverters 215. Each inverter may be formed by a serial combination of a p-type metal-oxide semiconductor (PMOS) transistor and a n-type metal-oxide semiconductor (NMOS) transistor. A Q output node for one of the inverters provides a one-bit filter weight. Conversely, a QB output node for a remaining one of the inverters provides the complement of the one-bit filter weight. During a read operation for accessing a row including bitcell 220, a word line voltage for a word line (WL) is asserted. The word line WL drives a gate of an NMOS access transistor M1 and an NMOS access transistor M2. Access transistor M1 couples between the Q output node and a bit line BL for a column including bitcell 220. Similarly, access transistor M2 couples between the QB output node and a complement bit line BLB for the column. When the word line WL is asserted, the access transistors M1 and M2 switch on so that one of the bit lines is discharged while another retains its pre-charged state. Since the cross-coupled inverters 215 require four transistors, the total number of transistors for bitcell 220 is six transistors, which is conventional for an SRAM bitcell. A controller such as a decoder 225 controls the assertion of word line WL. This assertion by the controller is part of the sequential assertion of the word lines for near memory system 200. For example, the controller may assert the word line for a first row for the calculation of a first output for the fully-connected layer, then assert the word line for a second row for the calculation of a second output for the fully-connected layer, and so on.

Figure 3:
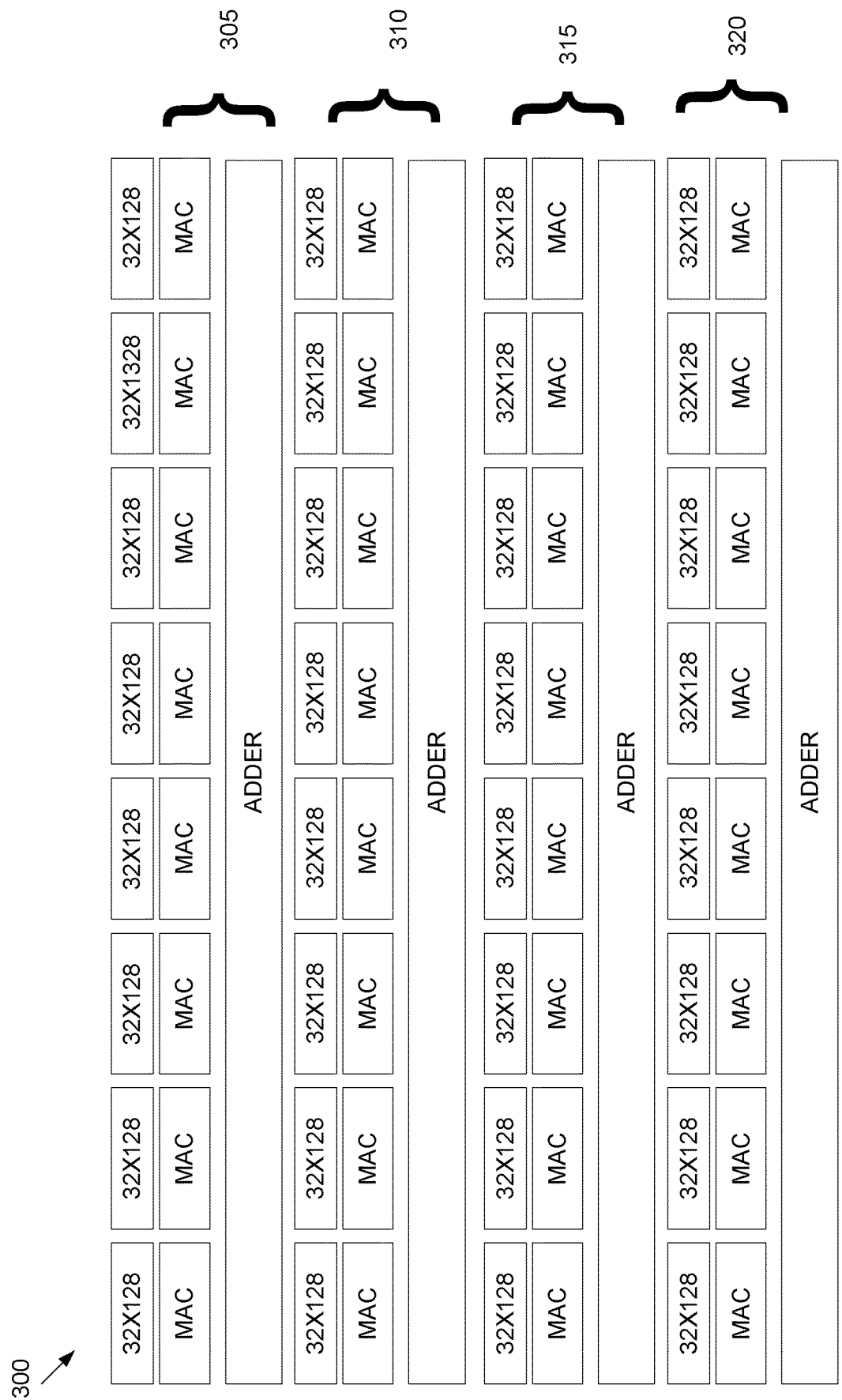
FIG. 3 illustrates a segmented near memory system in accordance with an aspect of the disclosure.

Although the number of output neurons is relatively small, the processing energy for near memory system 200 may be still be significant. For example, suppose there are 128 rows of bitcells. The bit lines extending across so many rows may have a substantial amount of capacitance. With such elevated bit line capacitance, the charging of a bit line pair after a read operation for a stored filter weight requires a corresponding amount of charge to be discharged to ground since a bit line in the bit line pair is discharged during the read operation. To reduce latency and decrease the power consumption, the bitcell array for a near memory system 300 may be segmented as shown in FIG. 3. For example, suppose that near memory system 200 of FIG. 2 had 128 rows of bitcells. Referring again to FIG. 1, a filter stores the weights for an output neuron. For example, output neuron 0 needs N filter weights to multiply by the N corresponding input neurons. There is thus a zeroth filter weight for the zeroth input neuron, a first filter weight for the first input neuron, and so on. Each input neuron is multiplied by its corresponding filter weight to form a product. The corresponding output neuron is a sum of all the resulting products. Without segmentation, an array for 128 filters and 1024 input neurons would be an array of 128 rows and 1024 columns.

Such an array is segmented in near memory system 300 into a first array 305, a second array 310, a third array 315, and a fourth array 320. Due to the segmentation, what would have been a column of 128 bitcells to form a filter in an unsegmented embodiment is subdivided in near memory system 300 into a column of 32 bitcells in first array 305, a corresponding column of 32 bitcells in second array 310, a corresponding column of 32 bitcells in third array 315, and a corresponding column of 32 bitcells in fourth array 320. It will be appreciated that the segmentation may be varied in alternative embodiments. Each array includes 32 rows of bitcells arranged in 1024 columns. In some embodiments, the semiconductor manufacturing process cannot support a word line that extends across such a relatively large number of columns. Each bitcell array may thus be sub-divided into sub-arrays of 32 rows by 128 columns (32×128). Since there are 1024 columns, there are thus eight sub-arrays per bitcell array in near memory 300 for each array but it will be appreciated that the number of columns and the number of rows may be varied in alternative embodiments. Each sub-array has its own MAC circuit. Due to the division of an array into sub-arrays, the accumulated output from each MAC circuit for an array is summed by an adder (ADDER) to generate an output for the fully-connected layer.

It will be appreciated that any suitable memory technology may be used to construct the segmented arrays of bitcells shown in FIG. 3. For example, arrays 305, 310, 315, and 320 may be arrays of SRAM bitcells, ferroelectric RAM (FRAM) bitcells, magnetic RAM (MRAM) bitcells, resistive RAM (RRAM) bitcells, or phase-change memory (PCM) bitcells.

The resulting segmentation into arrays such as arrays 305, 310, 315, and 320 is quite advantageous in reducing latency. Within each array, the processing of the rows occurs sequentially as controlled by a controller such as discussed with regard to near memory system 200. But the segmentation in near memory system 300 results in four rows being processed simultaneously so as to be four times faster than near memory system 200. More generally, if the number of arrays from the segmentation is N, then the calculation of the fully-connected layer would be N times faster than a comparable calculation without segmentation. In addition, the read energy for accessing a row is reduced from the segmentation since the bit lines for each array extend across a reduced number of rows as compared to a non-segmented architecture such as near memory system 200. It will be appreciated that the output of each adder may be quantized by a quantizer (not illustrated) in alternative embodiments. The MAC circuits are readily modified to support multi-bit filter weights and multi-bit input neurons since the MAC circuits are outside the bitcell array.

Figure 4:
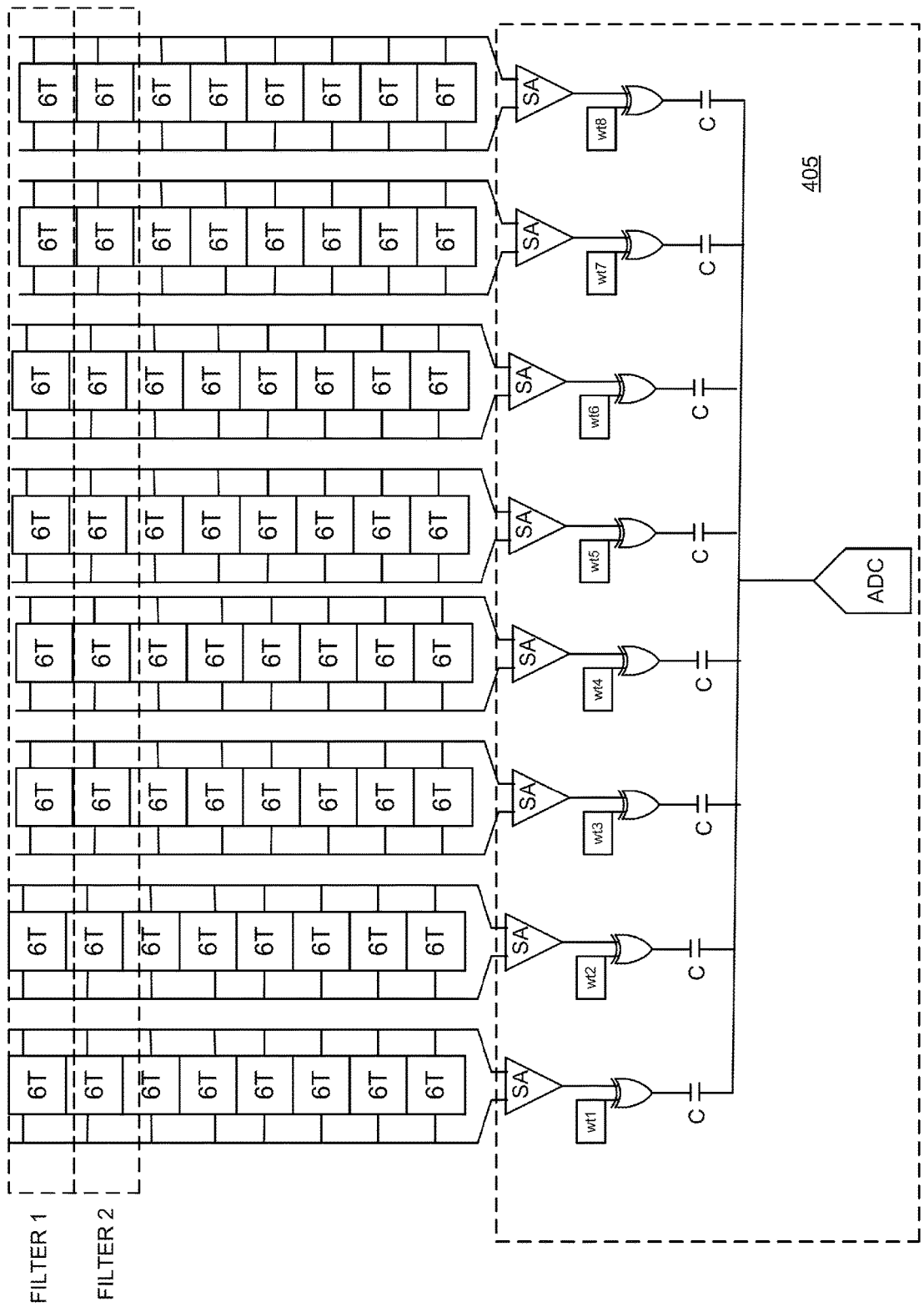
FIG. 4 illustrates a near memory system with an analog MAC circuit in which the filter weights and the input neuron weights are both single-bit signals in accordance with an aspect of the disclosure.

The digital processing in the MAC circuits in the preceding embodiments consumes power. To reduce this power consumption, near memory systems are disclosed herein that utilize an analog MAC circuit. An example one-bit stored filter weight, one-bit input neuron near memory system 400 with an analog MAC circuit 405 is shown in FIG. 4. The array of bitcells such as 6T bitcells is arranged by rows and columns as discussed for near memory system 200 or 300. Analog MAC circuit 405 includes a sense amplifier (SA) and a logic gate such as XNOR gate for each column as discussed with regard to the digital MAC circuits. But rather than use a digital adder, analog MAC circuit 405 includes a capacitor C for each column. Each column's XNOR gate drives a first plate of the corresponding capacitor C. A second plate of each capacitor C is coupled to an input of an analog-to-digital converter (ADC). Prior to a MAC operation, each second plate is charged to a power supply voltage by coupling the second plates to a power supply node while the first plates are grounded. After a row is accessed, the output of each XNOR gate will either be grounded or charged to the power supply voltage depending upon the result of its binary multiplication. The second plates remain coupled to the power supply node while the XNOR gates drive the first plates. Each capacitor C is thus either discharged or remains charged based upon the corresponding XNOR operation. An analog-to-digital converter (ADC) then converts the cumulative charge that remains for the capacitors C to provide the output neuron value.

Referring back to near memory systems 200 and 300, it will be appreciated that each MAC circuit may be implemented as an analog MAC circuit 405. The resulting analog MAC operation is quite advantageous as the MAC power consumption dominates in digital MAC circuit embodiments. But the use of analog MAC circuit 405 reduces power consumption over a comparable digital MAC implementation substantially.

Figure 5:
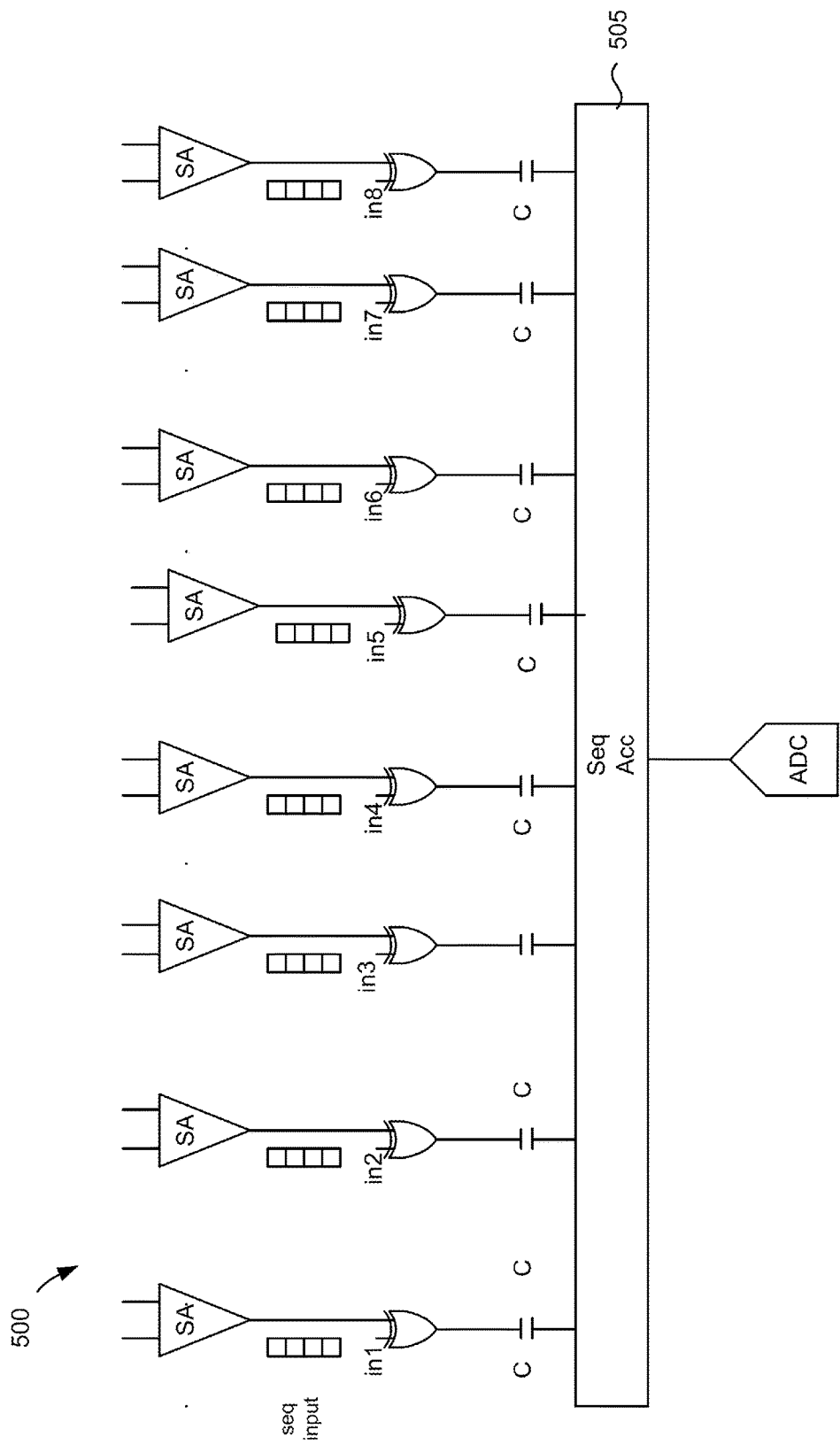
FIG. 5 illustrates a near memory system with an analog MAC circuit in which the filter weights are single-bit weights and the input neuron weights are multi-bit weights in accordance with an aspect of the disclosure.

An analog MAC circuit 500 for a single-bit filter weight and a multi-bit input neuron layer is shown in FIG. 5. The memory array is not shown in FIG. 5 for illustration clarity as it is arranged in rows and columns as discussed for near memory systems 200, 300 and 400. Analog MAC circuit 500 is analogous to analog MAC circuit 405 in that each column is associated with a sense amplifier (SA), an XNOR gate, and a capacitor C. Each XNOR gate processes its multi-bit input neuron sequentially bit by bit by magnitude such as from the least-significant bit and then increasing in magnitude to the most-significant bit. A sequential accumulator 505 then adds the results of the sequential processing of the multi-bit input neuron with the corresponding filter weight. In a sequential accumulation by sequential accumulator 505, the voltages from each bit of the multi-bit input neuron are accumulated according to their significance. For example, suppose that the multi-bit input neuron is three bits wide. Each bit results in a voltage on the second plates of the capacitors C that is scaled by sequential accumulator 505 according to the bit's significance. Sequential accumulator 505 then adds the resulting voltage to provide an accumulated voltage that is converted by an ADC into a digital value for the output neuron.

Figure 6:
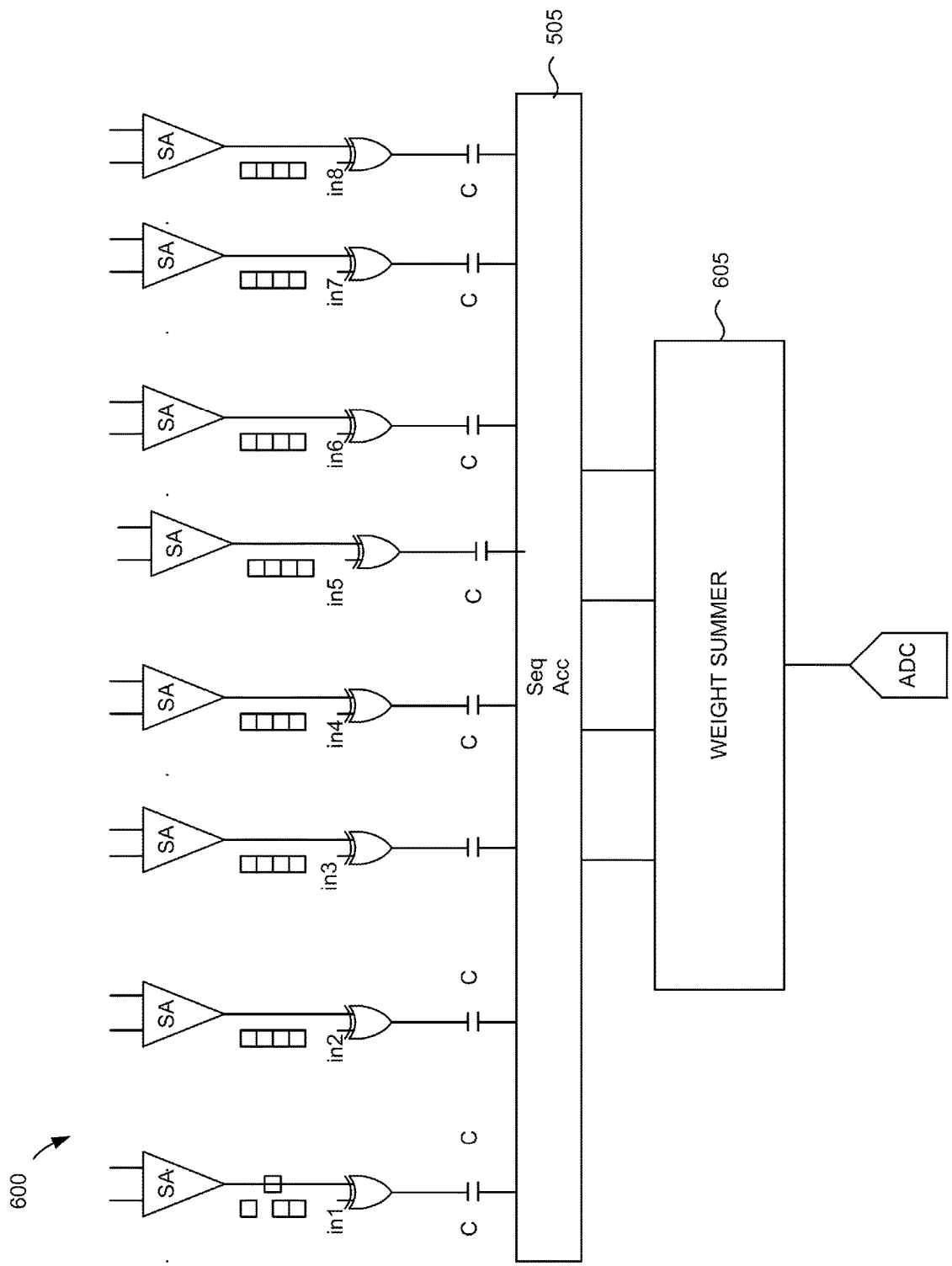
FIG. 6 illustrates a near memory system with an analog MAC circuit in which the filter weights and the input neuron weights are both multi-bit weights in accordance with an aspect of the disclosure.

The filter weight itself may be a multi-bit filter weight. An analog MAC circuit 600 for a multi-bit filter weight and a multi-bit input neuron layer is shown in FIG. 6. The bitcell array is not shown in FIG. 6 for illustration clarity but is arranged by rows and columns as discussed for near memory systems 200, 300, and 400. Because the filter weight is multi-bit, a single filter weight requires a set of rows of bitcells for its bits. The rows in a set of rows for a multi-bit filter weight are asserted sequentially according to their significance such as from the least-significant bit to the most-significant bit. Per each bit of the multi-bit weight, analog MAC circuit 600 functions as discussed with regard to analog MAC circuit 500. There is thus a sense amplifier SA, an XNOR gate, and a capacitor C for each column and also a sequential accumulator 505 in analog MAC circuit 600. While a row is asserted, the bits from the multi-bit input neuron are sequentially processed by each XNOR gate with the bit from the multi-bit filter weight and the results accumulated by sequential accumulator 505 as discussed analogously for analog MAC circuit 500. A second sequential accumulator 605 (which may also be designated as a weight summer 605) accumulates the results after each row in the set of rows for a multi-bit weight is accessed. The accumulation is weight summer 605 is scaled according to the significance for each bit in the multi-bit weight to provide the output neuron value.

Figure 7:
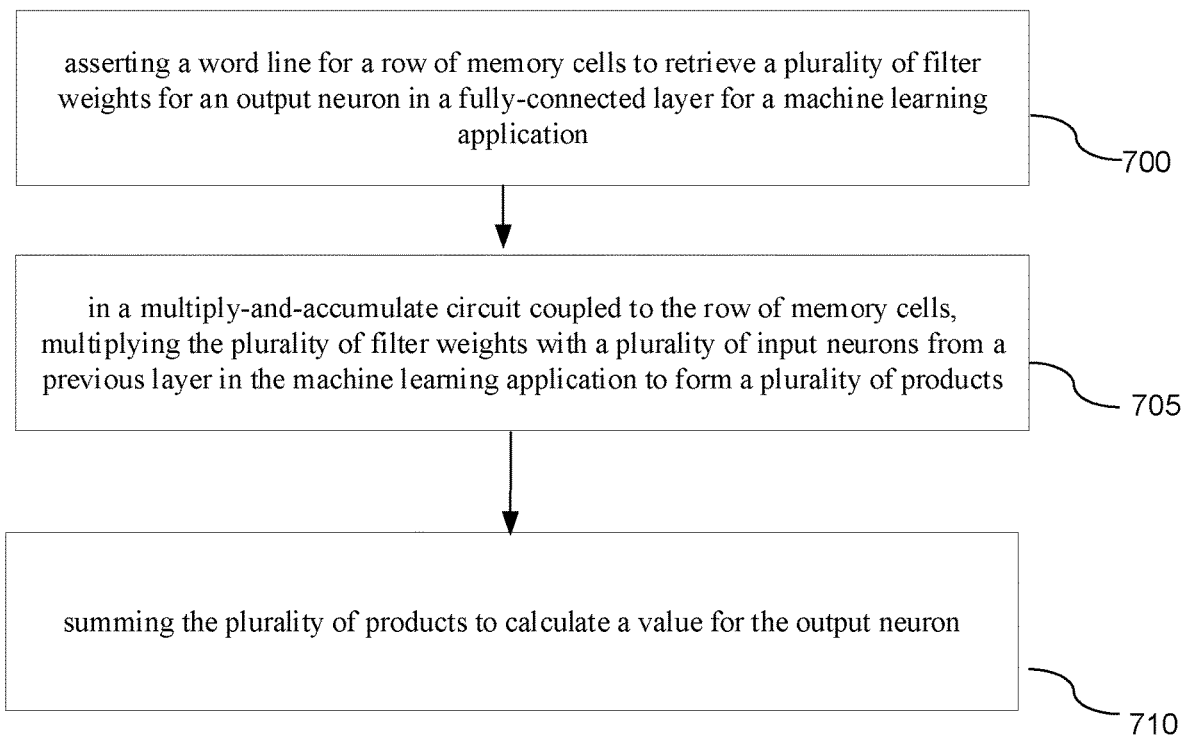
FIG. 7 is a flowchart for an example method of operation for a near memory system accordance with an aspect of the disclosure.

A flow chart for a near memory system method is shown in FIG. 7. The method includes an act 700 of asserting a word line for a row of memory cells to retrieve a plurality of filter weights for an output neuron in a fully-connected layer for a machine learning application. The assertion of a word line for either of near memory systems 200 and 300 is an example of act 700. Similarly, the assertion of a word line for a near memory system including any of analog MAC circuits 400, 500, and 600 is an example of act 700. The method further includes an act 705 of, in a multiply-and-accumulate circuit coupled to the row of memory cells, multiplying the plurality of filter weights with a plurality of input neurons from a previous layer in the machine learning application to form a plurality of products. The multiplication in the MAC logic disclosed herein is an example of act 705. Finally, the method includes an act 710 of summing the plurality of products to calculate a value for the output neuron. The summation of the plurality of products by the MAC circuits disclosed herein is an example of act 710.

Figure 8:
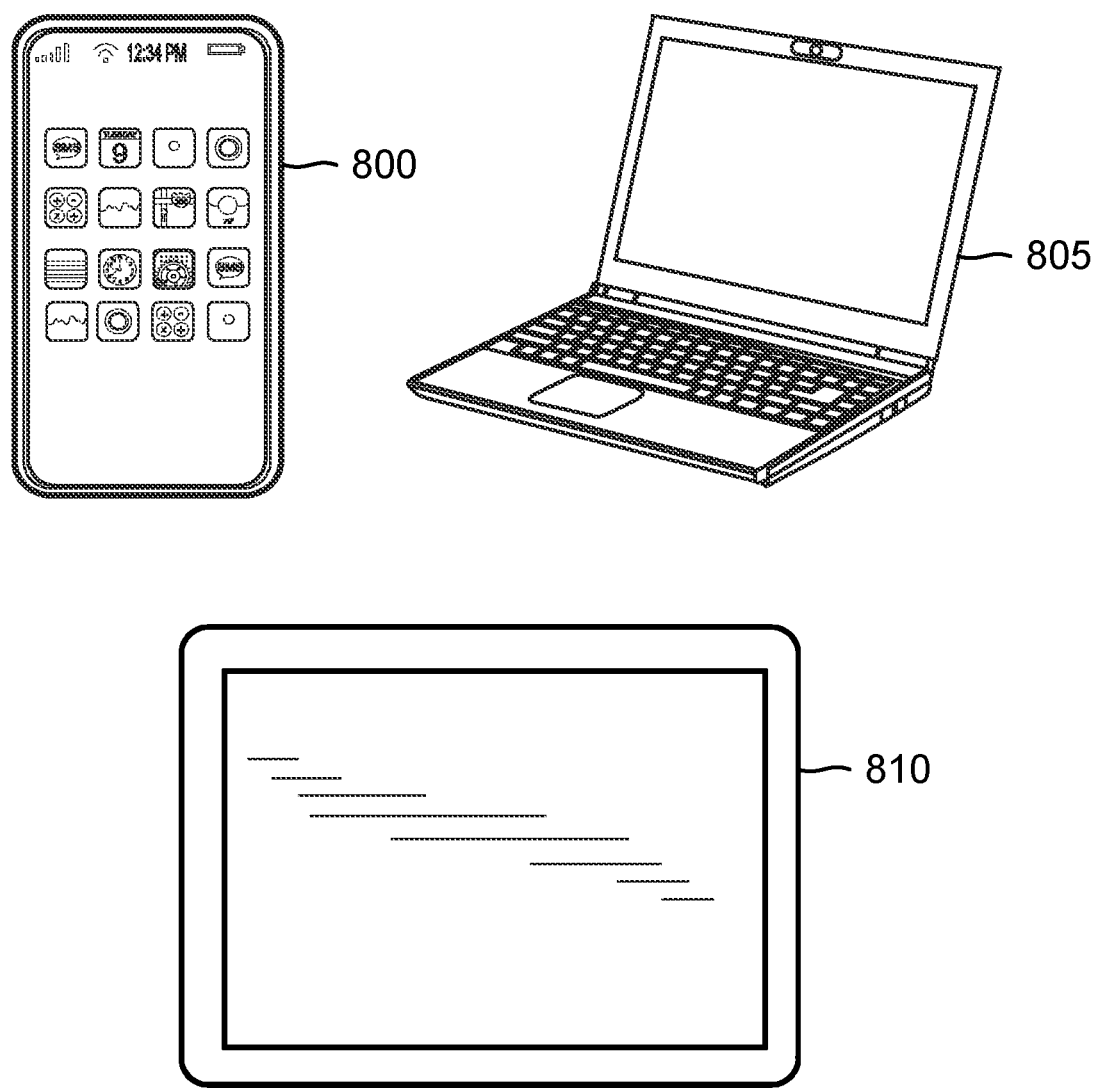
FIG. 8 illustrates some example electronic systems each incorporating a near memory system in accordance with an aspect of the disclosure.

A near memory system as disclosed herein may be advantageously incorporated in any suitable mobile device or electronic system. For example, as shown in FIG. 8, a cellular telephone 800, a laptop computer 805, and a tablet PC 810 may all include a near memory system in accordance with the disclosure. Other exemplary electronic systems such as a music player, a video player, a communication device, and a personal computer may also be configured with near memory systems constructed in accordance with the disclosure.

It will be appreciated that many modifications, substitutions and variations can be made in and to the materials, apparatus, configurations and methods of use of the devices of the present disclosure without departing from the scope thereof. In light of this, the scope of the present disclosure should not be limited to that of the particular embodiments illustrated and described herein, as they are merely by way of some examples thereof, but rather, should be fully commensurate with that of the claims appended hereafter and their functional equivalents.

What is claimed is:

1. A near memory system, comprising:
   an array of memory cells arranged into a plurality of rows and into a plurality of columns, wherein each row is configured to store a plurality of filter weights for a layer in a machine-learning application;
   a multiply-and-accumulate (MAC) circuit coupled to each column, the MAC circuit being configured to multiply the plurality of filter weights from an accessed-one of the rows with a plurality of inputs for the layer to provide a plurality of products, the MAC circuit being further configured to sum the plurality of products to provide an output for the layer;
   a plurality of word lines corresponding to the plurality of rows, each word line extending across its corresponding row; and
   a controller configured to sequentially assert the word lines to form the accessed-one of the rows.

2. The near memory system of claim 1, wherein each memory cell is selected from the group consisting of a static random access memory (SRAM) bitcell, a magnetic RAM (MRAM) bitcell, a resistive RAM (RRAM) bitcell, a ferroelectric RAM (FRAM) bitcell, and a phase-change memory (PCM) bitcell.

3. The near memory system of claim 2, wherein each SRAM bitcell is a six-transistor SRAM bitcell.

4. The near memory system of claim 1, wherein the MAC circuit includes a plurality of logic gates corresponding to the plurality of columns, and wherein each logic gate is configured to multiply a filter weight with an input to form a binary product.

5. The near memory system of claim 4, wherein each logic gate comprises an exclusive-not-or (XNOR) gate.

6. The near memory system of claim 5, wherein the MAC circuit further includes a digital adder to add an output from each XNOR gate.

7. The near memory system of claim 5, wherein the MAC circuit further includes:
   a plurality of capacitors corresponding to the plurality of XNOR gates, and wherein each XNOR gate is configured to drive a first plate for the corresponding capacitor.

8. The near memory system of claim 7, wherein the MAC circuit further includes an analog-to-digital converter coupled to a second plate for each capacitor.

9. The near memory system of claim 7, wherein each input is a multi-bit input, the MAC circuit further comprising a sequential accumulator coupled to a second plate of each capacitor, wherein the sequential accumulator is configured to sequentially accumulate a charge from each second plate from a serial processing of the multi-bit inputs to provide an accumulation result.

10. The near memory system of claim 9, wherein the layer is a fully-connected layer, and wherein the MAC circuit further includes an analog-to-digital converter configured to convert the accumulation result into an output for fully-connected layer.

11. A near memory system:
a plurality of arrays of memory cells, wherein each array is arranged into a plurality of rows and columns, and wherein each row is configured to store a plurality of filter weights for a layer in a machine-learning application, and wherein each array of memory cells is subdivided into a plurality of sub-arrays; and
a plurality of multiply-and-accumulate (MAC) circuits corresponding to the plurality of sub-arrays, each MAC circuit being coupled to each column in the corresponding sub-array, each MAC circuit being configured to multiply the plurality of filter weights from an accessed-one of the rows in the corresponding sub-array with a corresponding plurality of inputs to provide a plurality of products, the MAC circuit being further configured to sum the plurality of products to provide a sum, and wherein each array further includes an adder to add the sums from the array's MAC circuits to form an output for the array,
wherein each MAC circuit includes a plurality of logic gates corresponding to the plurality of columns in the corresponding sub-array, and wherein each logic gate is configured to multiply a filter weight with the corresponding one of the inputs to form a binary product.

12. The near memory system of claim 11, wherein each memory cell is a static random access memory (SRAM) bitcell.

13. The near memory system of claim 12, wherein each SRAM bitcell is a six-transistor SRAM bitcell.

14. The near memory system of claim 11, wherein each logic gate comprises an exclusive-not-or (XNOR) gate.

15. The near memory system of claim 14, wherein each MAC circuit further includes a digital adder to add an output from each of its XNOR gates.

16. The near memory system of claim 14, wherein each MAC circuit further includes:
a plurality of capacitors corresponding to the plurality of XNOR gates in the MAC circuit, and wherein each XNOR gate is configured to drive a first plate for the corresponding capacitor.

17. Near memory system of claim 16, wherein each MAC circuit further includes an analog-to-digital converter coupled to a second plate for each capacitor in the MAC circuit.

18. The near memory system of claim 16, wherein each input is a multi-bit input, each MAC circuit further comprising a sequential accumulator coupled to a second plate of each of the MAC circuit's capacitors, wherein the MAC circuit's sequential accumulator is configured to sequentially accumulate a charge from each second plate for each capacitor in the MAC circuit for a serial processing of the multi-bit inputs to provide an accumulation result.

19. The near memory system of claim 18, wherein the layer is a fully-connected layer, and wherein each MAC circuit further includes an analog-to-digital converter configured to convert the accumulation result into a digital value, and wherein each adder is further configured to add the digital value from the array's MAC circuits to provide an output for the fully-connected layer.

20. The near memory system of claim 11, wherein the near memory system is integrated into a mobile device.

21. The near memory system of claim 20, wherein the mobile device is cellular telephone.

22. A method for a near memory system, comprising:
asserting a word line for a row of memory cells to retrieve a plurality of filter weights for an output neuron in a layer for a machine learning application;
in a multiply-and-accumulate circuit coupled to the row of memory cells, multiplying the plurality of filter weights with a plurality of input neurons to form a plurality of products;
summing the plurality of products to calculate a value for the output neuron; and
sequentially asserting additional word lines to sequentially calculate values for additional output neurons in the layer.

23. The method of claim 22, wherein summing the plurality of products comprises digitizing a voltage from a plurality of capacitors.

24. The method of claim 22, wherein summing the plurality of products comprises a digital summing.

* * * * *